United States Patent
Shriner et al.

(10) Patent No.: US 9,224,592 B2
(45) Date of Patent: Dec. 29, 2015

(54) METHOD OF ETCHING FERROELECTRIC CAPACITOR STACK

(71) Applicant: Texas Instruments Incorporated, Dallas, TX (US)

(72) Inventors: John Christopher Shriner, Allen, TX (US); Abbas Ali, Plano, TX (US)

(73) Assignee: TEXAS INTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/473,768

(22) Filed: Aug. 29, 2014

(65) Prior Publication Data

US 2015/0072443 A1     Mar. 12, 2015

Related U.S. Application Data

(60) Provisional application No. 61/877,006, filed on Sep. 12, 2013.

(51) Int. Cl.
| | |
|---|---|
| *H01L 21/20* | (2006.01) |
| *H01L 21/02* | (2006.01) |
| *H01L 21/3213* | (2006.01) |
| *H01L 27/115* | (2006.01) |
| *H01L 49/02* | (2006.01) |
| *H01L 21/311* | (2006.01) |
| *H01J 37/32* | (2006.01) |
| *H01L 21/66* | (2006.01) |

(52) U.S. Cl.
CPC ..... *H01L 21/02197* (2013.01); *H01J 37/32963* (2013.01); *H01L 21/31122* (2013.01); *H01L 21/32136* (2013.01); *H01L 21/32139* (2013.01); *H01L 27/11507* (2013.01); *H01L 28/55* (2013.01); *H01L 28/65* (2013.01); *H01J 2237/334* (2013.01); *H01L 22/26* (2013.01)

(58) Field of Classification Search
CPC ............ H01L 21/311; H01L 21/31122; H01L 21/31691; H01L 21/32136; H01L 21/32051; H01L 27/0629
USPC ....... 438/3, 694–710.736; 257/E21.011, 664, 257/311
See application file for complete search history.

(56) References Cited

U.S. PATENT DOCUMENTS

| | | | | |
|---|---|---|---|---|
| 5,515,984 | A * | 5/1996 | Yokoyama et al. | 216/41 |
| 5,652,171 | A * | 7/1997 | Nagano et al. | 438/3 |
| 5,776,356 | A * | 7/1998 | Yokoyama et al. | 216/76 |
| 6,492,222 | B1 * | 12/2002 | Xing | 438/240 |
| 6,656,748 | B2 | 12/2003 | Hall et al. | |
| 2002/0008079 | A1 * | 1/2002 | Chung | 216/13 |
| 2002/0076936 | A1 * | 6/2002 | Iguchi | 438/710 |
| 2002/0155675 | A1 * | 10/2002 | Hartner et al. | 438/393 |

(Continued)

*Primary Examiner* — Michael Lebentritt
(74) *Attorney, Agent, or Firm* — Rose Alyssa Keagy; Frank D. Cimino

(57) ABSTRACT

A method of etching a ferroelectric capacitor stack structure including conductive upper and lower plates with a ferroelectric material, such as lead-zirconium-titanate (PZT), therebetween, with each of these layers defined by the same hard mask element. The stack etch process involves a plasma etch with a fluorine-bearing species as an active species in the etch of the conductive plates, and a non-fluorine-bearing chemistry for etching the PZT ferroelectric material. An example of the fluorine-bearing species is $CF_4$. Endpoint detection can be used to detect the point at which the upper plate etch reaches the PZT, at which point the gases in the chamber are purged to avoid etching the PZT material with fluorine. A steeper sidewall angle for the capacitor structure can be obtained.

12 Claims, 7 Drawing Sheets

(56) References Cited

U.S. PATENT DOCUMENTS

| | | | |
|---|---|---|---|
| 2002/0187645 A1* | 12/2002 | Ying et al. | 438/706 |
| 2003/0143853 A1* | 7/2003 | Celii et al. | 438/694 |
| 2003/0166326 A1* | 9/2003 | Kikuchi et al. | 438/396 |
| 2003/0176073 A1* | 9/2003 | Ying et al. | 438/710 |
| 2006/0252223 A1* | 11/2006 | Nakayama | 438/396 |
| 2008/0261332 A1* | 10/2008 | Wang et al. | 438/3 |

\* cited by examiner

METHOD OF ETCHING FERROELECTRIC CAPACITOR STACK

CROSS-REFERENCE TO RELATED APPLICATIONS

This application claims priority, under 35 U.S.C. §119(e), of Provisional Application No. 61/877,006, filed Sep. 12, 2013, incorporated herein by this reference.

STATEMENT REGARDING FEDERALLY SPONSORED RESEARCH OR DEVELOPMENT

Not applicable.

BACKGROUND OF THE INVENTION

This invention is in the field of integrated circuit manufacture. Embodiments of this invention are more specifically directed to the formation of capacitors in memory devices such as ferroelectric memories.

Conventional metal-oxide-semiconductor (MOS) and complementary MOS (CMOS) logic and memory devices are prevalent in modern electronic devices and systems, as they provide an excellent combination of fast switching times and low power dissipation, along with their high density and suitability for large-scale integration. As is fundamental in the art, however, those devices are essentially volatile, in that logic and memory circuits constructed according to these technologies do not retain their data states upon removal of bias power. Especially in mobile and miniature systems, the ability to store memory and logic states in a non-volatile fashion is very desirable. As a result, various technologies for constructing non-volatile devices have been developed in recent years.

A recently developed technology for realizing non-volatile solid-state memory devices involves the construction of capacitors in which the dielectric material is a polarizable ferroelectric material, such as lead-zirconium-titanate (PZT) or strontium-bismuth-tantalate (SBT), rather than silicon dioxide or silicon nitride as typically used in non-ferroelectric capacitors. Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits.

Non-volatile solid-state read/write random access memory (RAM) devices based on ferroelectric capacitors, such memory devices commonly referred to as "ferroelectric RAM", or "FeRAM", or "FRAM" devices, have been implemented in many electronic systems, particularly portable electronic devices and systems. FRAMs are especially attractive in implantable medical devices, such as pacemakers and defibrillators. Various memory cell architectures including ferroelectric capacitors are known in the art, including the well-known 2T2C (two transistor, two capacitor) cells. Another type of FRAM cell is based on the well-known "6T" CMOS static RAM cell, which operates as an SRAM cell during normal operation, but in which ferroelectric capacitors coupled to each storage node can be programmed with the stored data state to preserve memory contents in non-volatile fashion. Ferroelectric capacitors are also implemented in some integrated circuits as programmable analog capacitors.

FIG. 1a illustrates the construction of an example of a portion of an integrated circuit including a portion of a ferroelectric random access memory (FRAM). In this example, ferroelectric capacitors 10 and metal-oxide-semiconductor (MOS) transistor 11 are disposed at or near a semiconducting surface of a semiconductor substrate, although capacitors 10 and transistor 11 may instead be formed at the surface of a semiconductor layer that overlies an insulator layer, such as according to a silicon-on-insulator (SOI) technology as known in the art. In the example of FIG. 1a, isolation dielectric structures 15, gate electrode 16, and n-type source/drain regions 14 are disposed at or near the surface of substrate 12, in the conventional manner for MOS integrated circuits. N-channel MOS transistor 11 in the example of FIG. 1a includes n-type source/drain regions 14 at the surface of p-type substrate 12 (or of a p-type "well" formed into substrate 12, as the case may be), with gate electrode 16 overlying a channel region between source/drain regions 14, and separated from the channel region by a gate dielectric 17 in the conventional manner. Interlevel dielectric 13 is disposed over transistor 11, with conductive plugs 18 disposed in a contact opening through interlevel dielectric 12 to provide a conductive connection between source/drain regions 14 of transistor 1a and overlying conductors and other structures, such as lower plates 20a of ferroelectric capacitors 10.

In the example of FIG. 1a, ferroelectric capacitor 10 is formed of a ferroelectric "sandwich" stack of conductive plates 20a, 20b, between which ferroelectric material 22 is disposed. Lower plates 20a of capacitors 10 are each formed at a location overlying conductive plug 18 so as to be in electrical contact with the underlying source/drain region 14 by way of that conductive plug 18. Conductive plates 20a, 20b are typically formed of the same conductive material or materials as one another, for purposes of symmetry, simplicity of the manufacturing flow, and improved ferroelectric polarization performance. As typical in many conventional implementations, conductive diffusion barrier layer 23a, for example of titanium-aluminum oxynitride (TiAlON), is disposed between lower plate 20a and conductive plug 18 and interlevel dielectric 13; a similar barrier layer (not shown) of the same material will also typically be in place above upper plate 20b. As mentioned above, a common material used as ferroelectric material 22 in this conventional capacitor 10 is lead-zirconium-titanate (PZT), deposited by way of metalorganic chemical vapor deposition. Ferroelectric material 22 in capacitor 10 is desirably as thin as practicable, for purposes of electrical performance (e.g., capacitance), and for consistency with the deep sub-micron features used to realize modern integrated circuits.

Lower conductive plate 20a and upper conductive plate 20b are formed from one or more layers of conductive metals, metal oxides, and the like. A typical construction of lower conductive plate 20a is a stack of a diffusion barrier layer in contact with conductive plug 18 and a layer of a noble metal (e.g., Ir, Ru, Pt, Rh, Pt, Pd, Au) or metal oxide (e.g., RuOx, IrOx, PdOx, SrRuO₃) overlying the barrier layer and in contact with the ferroelectric material 22. As described in commonly assigned U.S. Pat. No. 6,656,748, incorporated herein by reference, in capacitors in which PZT serves as ferroelectric material 22, sputter deposited iridium (Ir) is a preferred material for the portion of lower conductive plate 20a that is in direct contact with the PZT. As mentioned above, upper conductive plate 20b is typically formed of the same materials as lower conductive plate 20a, deposited in the reverse order (e.g., with iridium in contact with the top surface of PZT ferroelectric material 22).

By way of background, U.S. Pat. No. 6,656,748, commonly assigned herewith and incorporated herein by reference, describes a method of forming an integrated circuit including ferroelectric capacitors. In particular, this Patent describes the formation ferroelectric capacitors including a "stack etch", by way of which the upper and lower plates, and the PZT ferroelectric material therebetween, are etched using the same patterned mask element. The etch chemistry and process described in that Patent, as well as other conventional ferroelectric stack etches, result in a non-vertical sidewall profile for the structure, an example of which is shown in detail in FIG. 1b. As shown in that Figure, the sidewalls of upper and lower plates 20a, 20b, PZT ferroelectric material 22, and barrier layer 23a are at an angle $\phi$ relative to the horizontal; as known in the art, the sidewall angles of plates 20a, 20b and layer 23a may vary slightly from one another and from angle $\phi$ of ferroelectric material 22, considering the differences in their material properties, but the sidewall of the overall structure of capacitor 10 will generally follow the sidewall angle $\phi$ of ferroelectric material 22. The view of FIG. 1b also illustrates the presence of hard mask element 23b, typically formed of the same material as barrier layer 23a, following the stack etch. Hard mask element 23b defines the location and dimensions of upper plate 20a; as shown in FIG. 1b, hard mask element 23b tends to be etched back from its original dimensions 23b' as barrier layer 23a is etched. In modern conventional implementations, angle $\phi$ is about 70°. (This angle $\phi$ as shown in FIGS. 1a and 1b is shallower than this typical 70° value to emphasize its effect, as will now be described.)

This non-vertical sidewall angle $\phi$ of conventional ferroelectric capacitors has been observed to limit the density of ferroelectric capacitors in integrated circuits. In this regard, FIG. 1a illustrates certain dimensions in the structure that determine the maximum density of structures in an array of ferroelectric capacitors 10. As known in the art, the capacitance of any capacitor is directly proportional to the area of its dielectric material. In the example of FIG. 1a, width $W_{PZT}$ of ferroelectric material 22 thus determines the capacitance of capacitors 10, which is constant over all capacitors 10 in a given array. Circuit requirements typically determine the minimum acceptable capacitance of capacitors 10, and thus determine the value of this width $W_{PZT}$. Minimum distance $D_{cap}$ between lower plates 20a of adjacent capacitors 10 is selected for the manufacturing technology to avoid capacitor-to-capacitor shorting; similarly, a minimum distance $D_{ct}$ between lower plates 20a and adjacent contact plugs 18 is selected to avoid capacitor-to-contact shorting. These minimum distances $D_{cap}$, $D_{ct}$ typically depend on the manufacturing and photolithography technology being used.

As evident from FIG. 1a, however, the non-vertical sidewall angle $\phi$ of the ferroelectric stack (i.e., barrier layer 23a, plates 20a, 20b, and ferroelectric material 22) affects the spacing of capacitors 10 from one another and from adjacent contacts. As-patterned hard mask elements 23b' define the dimensions and placement of corresponding upper plates 20b. But in addition to the spacing between hard mask elements 23b' of adjacent capacitors 10 (and capacitor 10 relative to an adjacent contact), the sidewall angle $\phi$ must be taken into account in order to maintain the necessary minimum distances $D_{cap}$, $D_{ct}$. A shallower sidewall angle $\phi$ requires larger spacing between as-patterned hard mask elements 23b' for adjacent capacitors 10, and between hard mask elements 23b' and adjacent contact plugs 18, in order to maintain minimum distances $D_{cap}$, $D_{ct}$ for a given ferroelectric width $W_{PZT}$. This layer spacing results in reduced density of ferroelectric capacitors 10 per unit chip area. Conversely, a steeper sidewall angle $\phi$ would allow closer spacing of as-patterned hard mask elements 23b', attaining an increased ferroelectric capacitor density.

By way of further background, it is known that sidewall angles of a structure being etched can be steepened by performing a plasma etch under conditions of increased bias RF power applied to the electrode at which the semiconductor wafer is disposed.

BRIEF SUMMARY OF THE INVENTION

Disclosed embodiments provide a method of forming a ferroelectric capacitor stack that avoids plate-to-plate shorting of the capacitor while steepening the sidewall angle of the stack.

Disclosed embodiments provide such a method that enables a higher density layout of ferroelectric capacitor in an integrated circuit while maintaining acceptable switching polarization and adequate spacing between each capacitor and adjacent elements.

Disclosed embodiments provide such a method that avoids degradation of the ferroelectric material by contamination.

Disclosed embodiments provide such a method that relaxes tradeoffs among switching polarization performance and capacitor spacing critical dimension margin for a given manufacturing technology node.

Disclosed embodiments provide such a method that reduces intra-wafer and inter-wafer variation in capacitor spacing critical dimension margin.

Other objects and advantages of the disclosed embodiments will be apparent to those of ordinary skill in the art having reference to the following specification together with its drawings.

According to certain embodiments, a plasma stack etch of a ferroelectric stack including upper and lower conductive plate layers with a ferroelectric layer, such as lead-zirconium-titanate (PZT), disposed therebetween involves the use of a fluorine-bearing species for etching the plate layers. After deposition of the stacked layers, a hard mask element is deposited overall and patterned and etched to define the locations of the ferroelectric elements. A plasma etch using a fluorine-bearing species such as $CF_4$ is used to etch the upper plate layer. Upon the etch reaching the ferroelectric layer, the etch chemistry is changed to a non-fluorine-bearing chemistry for etching the ferroelectric layer; after which a fluorine-bearing species is used to etch the lower plate layer.

DETAILED DESCRIPTION OF THE INVENTION

The one or more embodiments described in this specification are implemented into the formation of ferroelectric capacitors as implemented into a ferroelectric memory, as it is contemplated that such implementation is particularly advantageous in that context considering the criticality of capacitor density in the memory array on overall chip area. However, it is also contemplated that concepts of this invention may be beneficially applied to in other applications, for example ferroelectric elements as used in other digital and analog devices. Accordingly, it is to be understood that the following description is provided by way of example only, and is not intended to limit the true scope of this invention as claimed.

The stack etch process that defines the layered structure of ferroelectric capacitors in an integrated circuit has several fundamental constraints. The stack etch must ensure that the ferroelectric capacitors in an array are not shorted to one another, that the ferroelectric capacitors are not shorted to other adjacent structures such as contacts, and that conductive plates on either side of the ferroelectric dielectric material in each capacitor are not shorted to one another, while maintaining the necessary switching polarization for the circuit. In addition, as described in the above-incorporated U.S. Pat. No. 6,656,748, exposure of lead-zirconium-titanate (PZT) ferroelectric material to a fluorine etchant results in contamination at the interfaces between the ferroelectric material and the conductive plates. This contamination is believed to be due to fluorine selectively chemically attaching elemental portions within the PZT film, rather than only the exposed sidewall edges, and has been observed to cause degradation of the PZT film and reduction in its polarization properties.

As mentioned above, it is known that sidewall angles of a structure being etched can be steepened by performing a plasma etch under conditions of increased bias RF power applied to the electrode at which the semiconductor wafer is disposed, thus favoring the physical etching mechanism and increasing the anisotropy of the etch. However, it has been observed that this increasing of bias RF power in the stack etch of ferroelectric capacitors, particularly during the etch of the lower plate material, increases the tendency of iridium metal from the lower conductive plate to sputter onto the sidewalls of the ferroelectric material, which shorts out the capacitor by providing a conductive path between the upper and lower capacitor plates. Reducing the bias power increases chemical etching and decreases physical etching, which reduces this sputtering effect and thus the vulnerability of the capacitors to shorting, but also undesirably softens the sidewall angle.

Figure 1A:
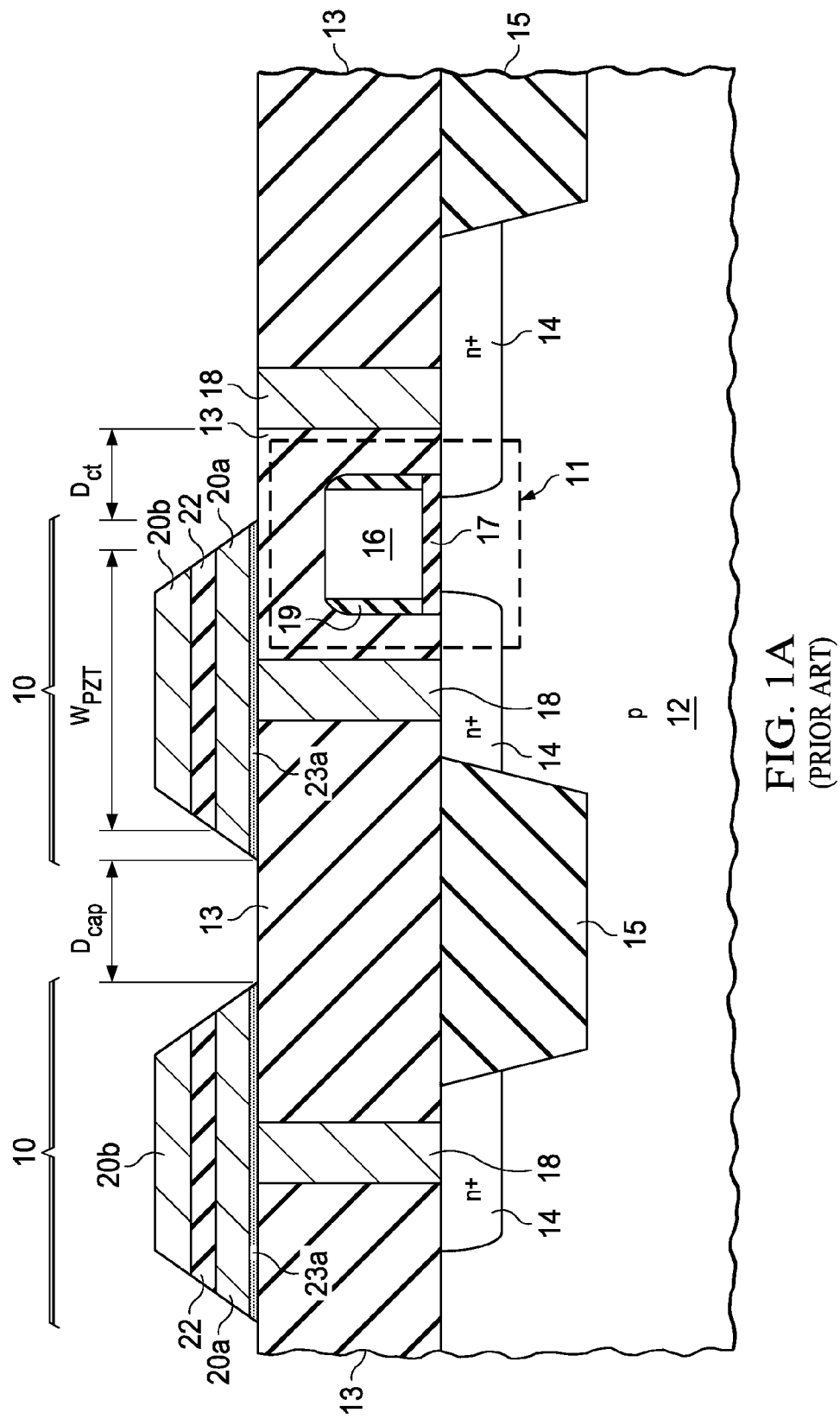
FIGS. 1a and 1b are cross-sectional views of a portion of a partially-fabricated integrated circuit including a conventional ferroelectric capacitor.
Figure 1B:
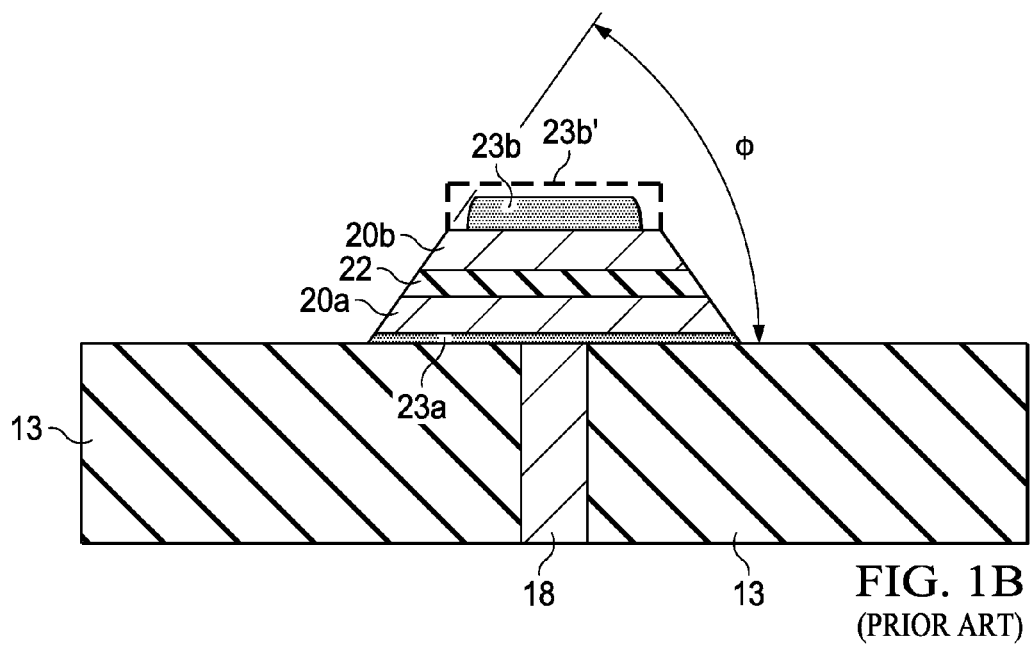

As a result of these constraints, these conventional stack etch processes result in a ferroelectric capacitor stack with a non-vertical sidewall angle, as discussed above relative to FIGS. 1a and 1b. As advances continue to be made in semiconductor manufacturing technology that enable higher density circuits and increased integrated circuit functionality, the limiting effects of the non-vertical sidewall angle of ferroelectric capacitors on critical dimension spacing have greater impact. Specifically, these conventional stack etch processes prevent the density of ferroelectric capacitors from increasing to the same extent that transistors and other elements in the integrated circuit are scaled.

According to the disclosed embodiments, a stack etch process incorporates a fluorine-bearing species, such as carbon tetrafluoride ($CF_4$), into the etch of the upper and lower conductive plates, for example including those formed of iridium metal. In these embodiments, this etch is implemented in a way that does not cause contamination of the iridium-PZT interfaces, and that enables the use of high bias power to steepen the sidewall angle of the stack while avoiding shorting of the resulting capacitor structures. This steeper sidewall angle enables closer spacing of the capacitors in the integrated circuit layout, and thus increased capacitor density, while maintaining the necessary spacing of capacitors relative to adjacent structures and maintaining good switching polarization performance of the capacitors.

Figure 3:
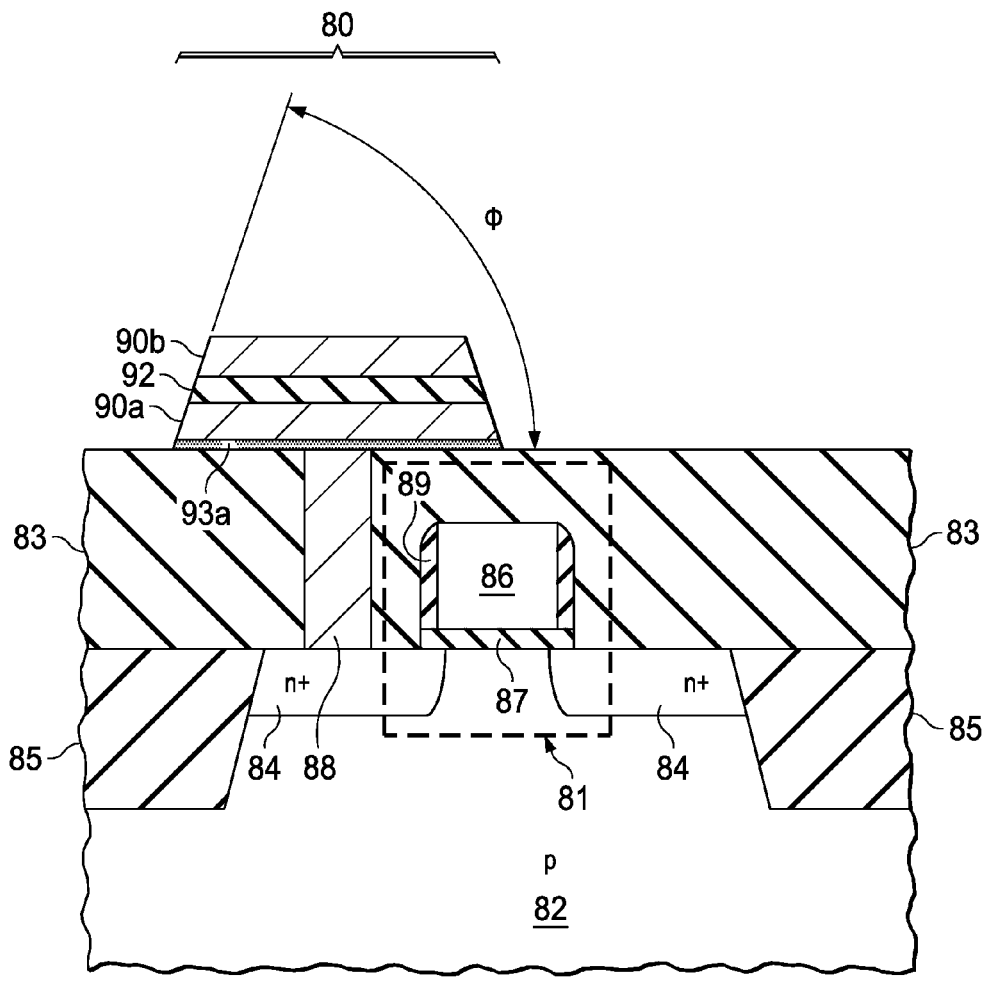
FIG. 3 is a cross-sectional view of a partially-fabricated integrated circuit, including a ferroelectric capacitor and a transistor, constructed according to disclosed embodiments.

A process of fabricating an integrated circuit including one or more ferroelectric capacitors and underlying transistors as shown in FIG. 3, will now be described according to an embodiment. The structure of FIG. 3 resembles that of FIG. 1a, and as such includes capacitor 80 and transistor 81. As in the example of FIG. 1a, ferroelectric capacitor 80 is formed of a ferroelectric "sandwich" stack of lower conductive plate 90a, ferroelectric material 92, and upper conductive plate 90b, overlying at least part of transistor 81 and separated therefrom by interlevel dielectric 83. As shown in FIG. 3, lower plate 90a is formed at a location overlying conductive plug 88 through interlevel dielectric 83 so as to be in electrical contact with the underlying source/drain region 84 of transistor 81, via conductive barrier layer 93a. Also as shown in FIG. 3, n-channel transistor 81 is constructed in the conventional manner to have n-channel source/drain regions 84 disposed at the surface of p-type substrate 82 (or of a p-type "well" formed into substrate 82, as the case may be), defined by isolation dielectric structures 85 and separated from one another, within a given transistor 81, by a channel region over which gate electrode 86 is disposed. Of course, p-channel MOS transistors, or transistors according to other technologies, may alternatively or additionally be included in the structure. In any case, the structure of this embodiment as shown in FIG. 3 is thus similar to the conventional structure shown in FIG. 1a, except that the sidewall angle φ of the ferroelectric stack is significantly steeper than that of conventional devices, as a result of the stack etch process of the disclosed embodiments, as will now be described in connection with FIGS. 2a and 2b, and FIGS. 4a through 4h.

Figure 2A:
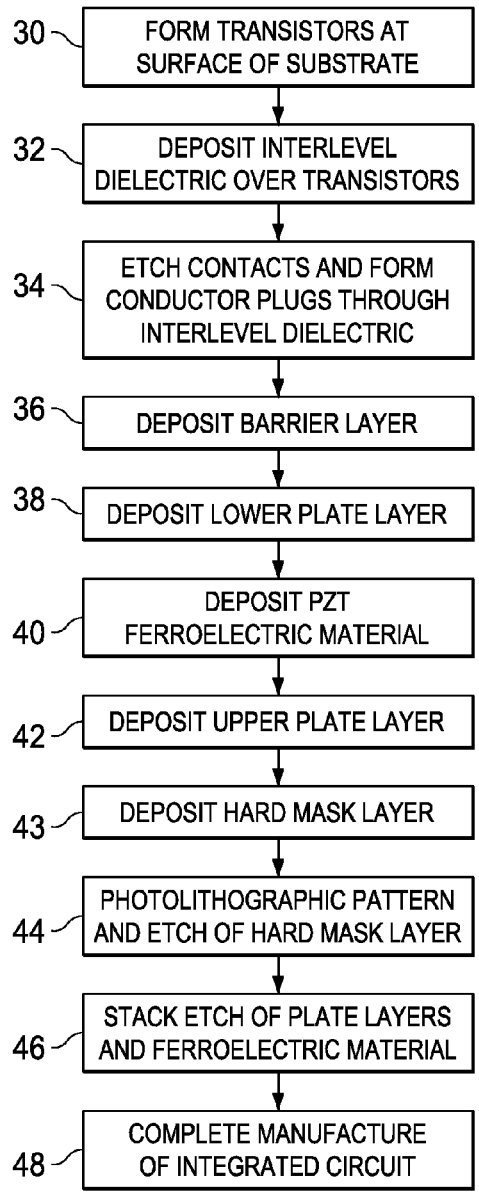
FIGS. 2a and 2b are flow diagrams illustrating a process of forming a ferroelectric capacitor according to disclosed embodiments.

The process of FIG. 2a begins, in this embodiment, with the formation of transistors 81 at or near the surface of semiconductor substrate 82, in process 30. Alternatively, capacitor 80 and transistor 81 may instead be formed at the surface of a semiconductor layer that overlies an insulator layer, such as according to a silicon-on-insulator (SOI) technology as known in the art. As part of process 30, isolation dielectric structures 85, the appropriate doped wells (if present) and gate dielectric layer 87 are formed into substrate 82 in the conventional manner for MOS integrated circuits. Conventional deposition and photolithographic patterning and etch of polysilicon material to define gate electrode 86 overlying gate dielectric 87 are then performed according to conventional MOS processes. For the case of n-channel transistor 81, n-type source/drain regions 84 are formed on either side of gate electrode 86 by ion implantation and subsequent activation anneal, in the well-known self-aligned manner. As mentioned above, p-channel MOS transistors may alternatively or additionally be formed in this process 30, as may transistors of other technologies and other devices that are to be formed near the surface of substrate 82 and beneath the eventual ferroelectric capacitors 80.

In process 32 of FIG. 2a, interlevel dielectric 83 is then deposited over transistor 81 in the conventional manner, for example by chemical vapor deposition (CVD) from a precursor of tetraethyl orthosilicate (TEOS), followed by planarization if desired. In process 34, contact openings are etched through interlevel dielectric 83 at selected locations at which contract is to be made through that film. These locations include at the eventual location of ferroelectric capacitor 80, and also at locations overlying source/drain regions 84 and gate electrode 86, among others. Also in process 34, the material (e.g., tungsten, titanium, or alloys thereof) of conductive plugs 88 is deposited overall and etched back, to form conductive plugs 88 disposed within those contact openings through interlevel dielectric 83.

The formation of ferroelectric capacitor 80 then begins in process 36, with the deposition of barrier layer 93a. In this embodiment, barrier layer 93a of TiAlON is sputter deposited overall in process 36, to the desired thickness. Other materials, such as TaSiN, CrN, HfN, TaN, HfAlN, CrAlN, TiSiN, CrSiN, and the like may alternatively or additionally be deposited to serve as diffusion barrier materials to prevent diffusion of constituents of atoms from the eventual lower conductive plate layer 90a into the active regions of transistors 81, as known in the art. Layers of other conductive material, including oxidation barrier layers, may additionally be deposited in process 36, if desired.

In process 38, one or more conductive layers are deposited over barrier layer 93a to serve as lower conductive plate layer 90a of capacitor 80. Typically, process 38 is performed by the physical vapor deposition (PVD) of the desired material, typically by way of sputter deposition although other suitable PVD techniques may alternatively be used. In this embodiment, a layer of iridium (Ir) metal is deposited in process 38 as the major portion of the thickness of lower conductive plate layer 20a.

In process 40, PZT ferroelectric material 92 is then deposited overall, for example by conventional metalorganic chemical vapor deposition (MOCVD). An example of a multi-step approach suitable for PZT deposition process 40 is described in copending and commonly assigned U.S. application Ser. No. 14/169,120, filed 30 Jan. 2014, entitled "Multi-Step Deposition of Ferroelectric Dielectric Material", incorporated herein by reference. Following process 40, upper conductive plate layer 90b is then deposited overall in process 42. Typically, the material deposited in process 42, and the manner of such deposition, is essentially identical to that of lower conductive plate layer 90a deposited in process 38.

Figure 4A:
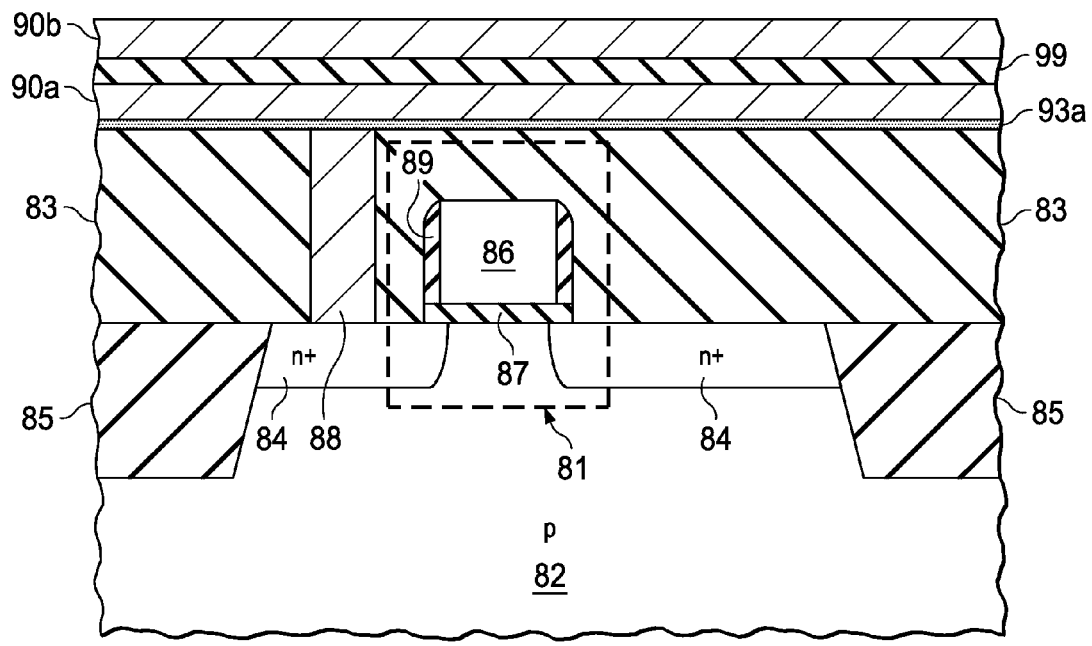
FIGS. 4a through 4h are cross-sectional views of a portion of an integrated circuit including a ferroelectric capacitor, according to an embodiment.

FIG. 4a illustrates the structure of the integrated circuit in which ferroelectric capacitor 80 and transistor 81 are constructed, at a point in its manufacture following process 42. As evident in FIG. 4a, each of barrier layer 93a, lower conductive plate layer 90a, ferroelectric material 92, and upper conductive plate layer 90b are deposited over the surface of the structure, extending over interlevel dielectric 83 and conductive plugs 88 formed through that dielectric. The thicknesses of these layers are contemplated to be as appropriate for the particular geometry of the structure and the electrical characteristics. In modern sub-micron integrated circuits, it is contemplated that the thicknesses will vary among one another, but will typically be on the order of tens of nanometers, with barrier layer 93a typically being somewhat thinner than the other layers of ferroelectric capacitor 80.

Figure 4B:
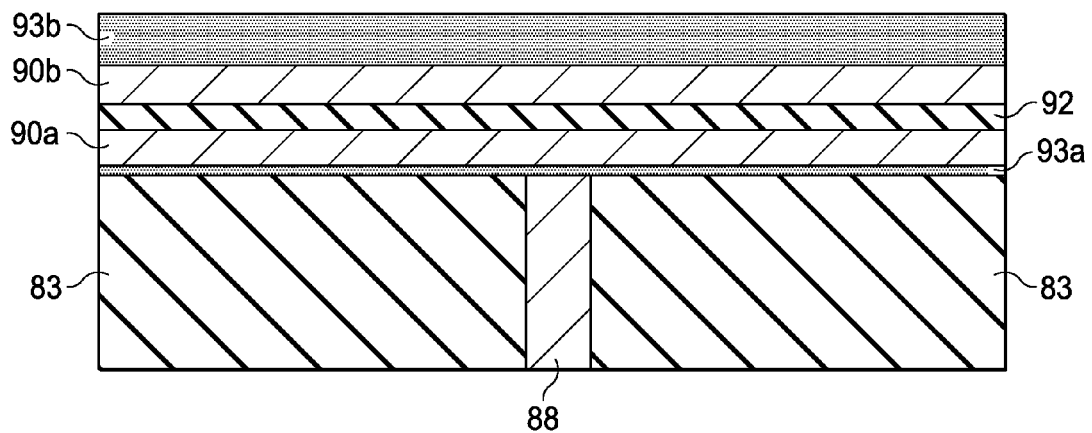

Process 43 is next performed to deposit a hard mask layer over upper conductive plate layer 90b; the result of process 43 is illustrated in FIG. 4b. In this embodiment, hard mask layer 93b is of the same material as barrier layer 93a, for example TiAlON, and will be deposited in the same manner, for example by sputter deposition. As evident from FIG. 4b, however, it is contemplated that hard mask layer 93b will typically be deposited to a greater thickness than that of lower barrier layer 93a.

Figure 4C:
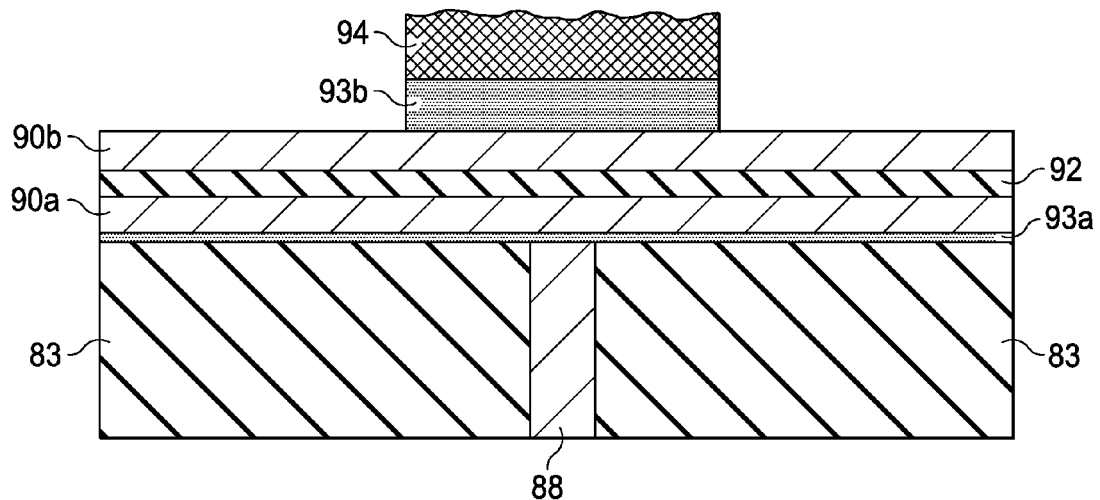
Figure 4D:
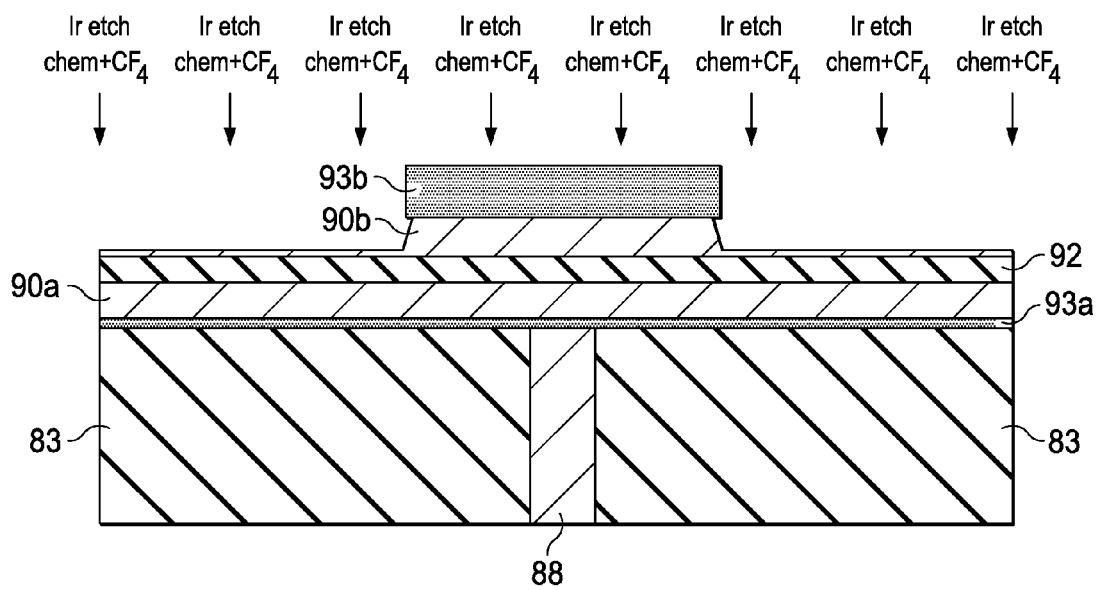
Figure 4E:
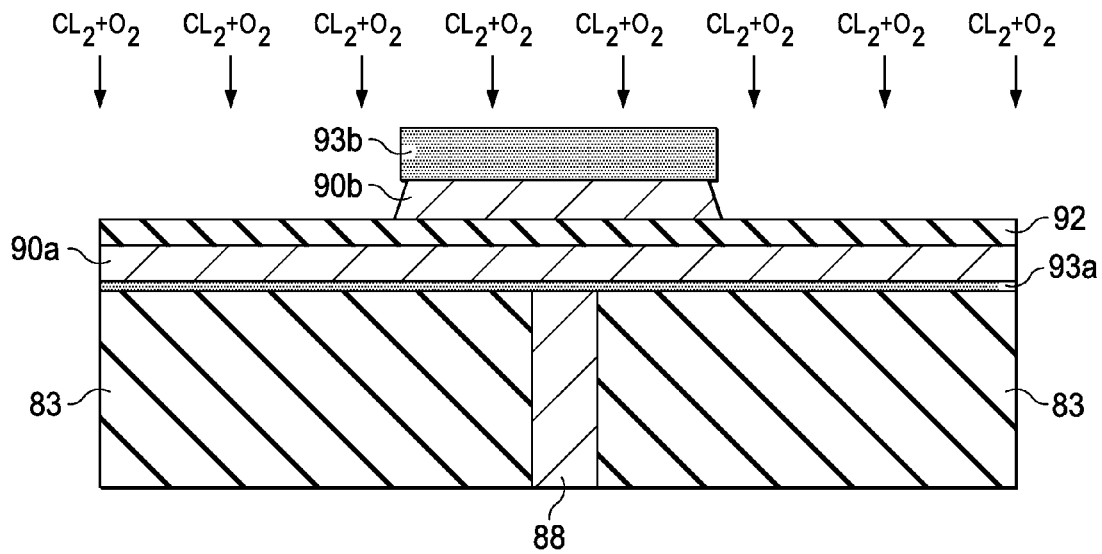

In process 44, hard mask layer 93b is photolithographically patterned and etched, to define mask elements that in turn define the location and size of ferroelectric capacitor 80. Photolithography process 44 is performed in the conventional manner, with the appropriate thickness of photoresist deposited over hard mask layer 93b, exposed via a photomask or reticle and developed to define the desired mask elements at the desired locations. Also in process 44, hard mask layer 93a is etched to remove those portions that are not protected by photoresist. FIG. 4c illustrates the result of process 44 at the location of ferroelectric capacitor 80, with photoresist portion 94 remaining in place over hard mask element 93b. Remaining photoresist portion 94 is then ashed or otherwise removed from the structure.

Once mask elements of hard mask layer 93a are defined in process 44, stack etch process 46 is then carried out to form ferroelectric capacitor 80. According to embodiments, stack etch process 46 is a plasma etch of upper conductive plate layer 90a, ferroelectric layer 92, lower conductive plate layer 90b, and barrier layer 93a, using mask element 93b for each of these layers. As will be evident from the following description according to this embodiment, the wafer being etched will remain within the same plasma etch chamber throughout the etch of these layers, with the gas composition and perhaps the RF power levels changing as these layers are sequentially etched.

Figure 2B:
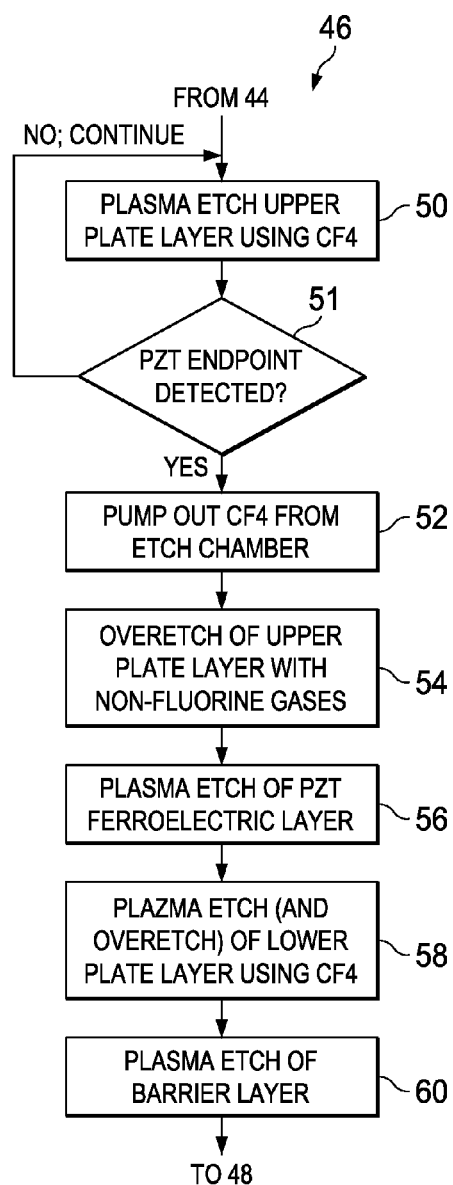

Referring now to FIG. 2b, stack etch process 46 according to an embodiment will be described in detail. Stack etch process 46 begins with the etching of upper conductive plate layer 90a in process 50, using hard mask element 93b to mask this etch. According to this embodiment, which is shown schematically in FIG. 4d, process 50 is a plasma etch using a fluorine-bearing active species. For example, the gases introduced into the plasma chamber for etch process 50 include chlorine and oxygen gases at flows similar to those of conventional iridium etch processes, in combination with a fluorine-bearing gas, such as $CF_4$, at a flow ranging from about 10 sccm to about 30 sccm, more typically at a flow ranging from about 15 sccm to about 26 sccm. According to this embodiment, plasma etch process 50 is performed under conditions of relatively high bias power at the lower plasma electrode in the chamber (upon which the wafer is placed). For example, etch process 50 may be performed at a source RF power (at the top electrode) level of on the order of 2400 W, and a bias RF power (at the bottom electrode, at which the wafer is disposed) level of on the order of 1300 W, at relatively low chamber pressure (e.g., 2.25 mT) and a process temperature of about 145 degC. The pressure and temperature conditions may remain the same throughout stack etch process 46.

According to this embodiment, process 50 for the etch of upper conductive plate layer 90a continues until PZT ferroelectric layer 92 begins to be etched, as determined in decision 51 of FIG. 2b. According to this embodiment, the plasma etch chamber includes endpoint detection capability to determine when the etch of process 50 begins to etch PZT ferroelectric layer 92. An example of endpoint detection useful in connection with this embodiment is the monitoring of changes in the optical emission from the chamber, with a change in optical emission from that emitted during the etch of iridium indicating that PZT ferroelectric layer 92 is beginning to be etched. For the reasons discussed above, the use of a fluorine species to etch PZT has been observed to cause contamination at the PZT-plate interfaces, which reduces polarization performance. As such, upon this early detection of PZT ferroelectric layer 92 being etched by the fluorine-bearing species (decision 51 is "yes"), etch process 50 with its chemistry terminates, and process 52 is performed to pump out the plasma chamber using an inert gas, specifically to evacuate the $CF_4$ species from the chamber. At this point in the process, it is contemplated that some amount of iridium of upper conductive plate 90b remains at the exposed surface of the structure (i.e., not covered by the hard mask element). As such, overetch process 54 is performed to remove this remaining iridium or other metal of upper conductive plate layer 90a using non-fluorine-bearing species only; for example, overetch process 54 may be a timed etch, using chlorine and oxygen as the active species, as shown schematically in FIG. 4e.

Figure 4F:
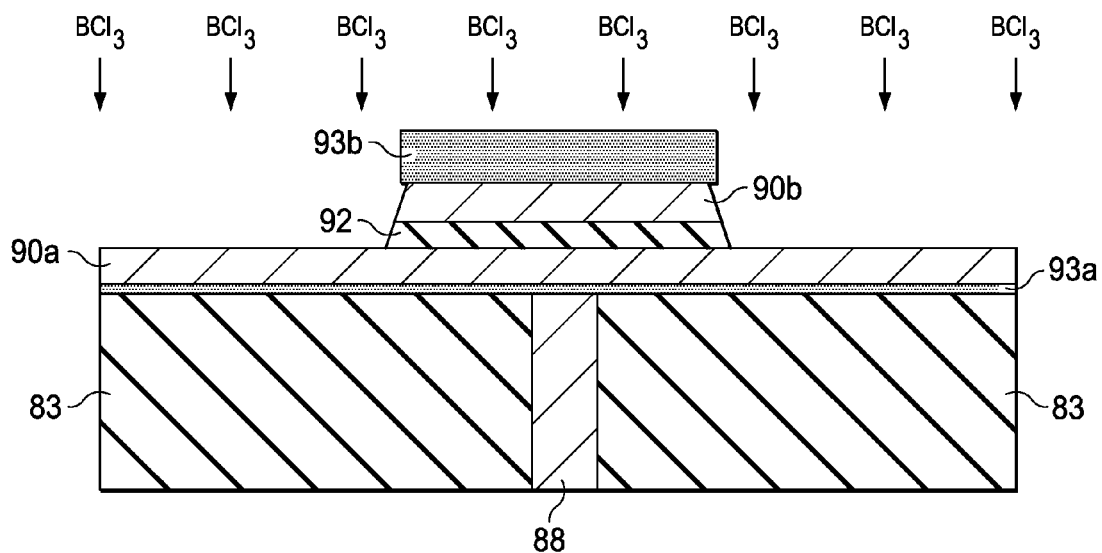
Figure 4G:
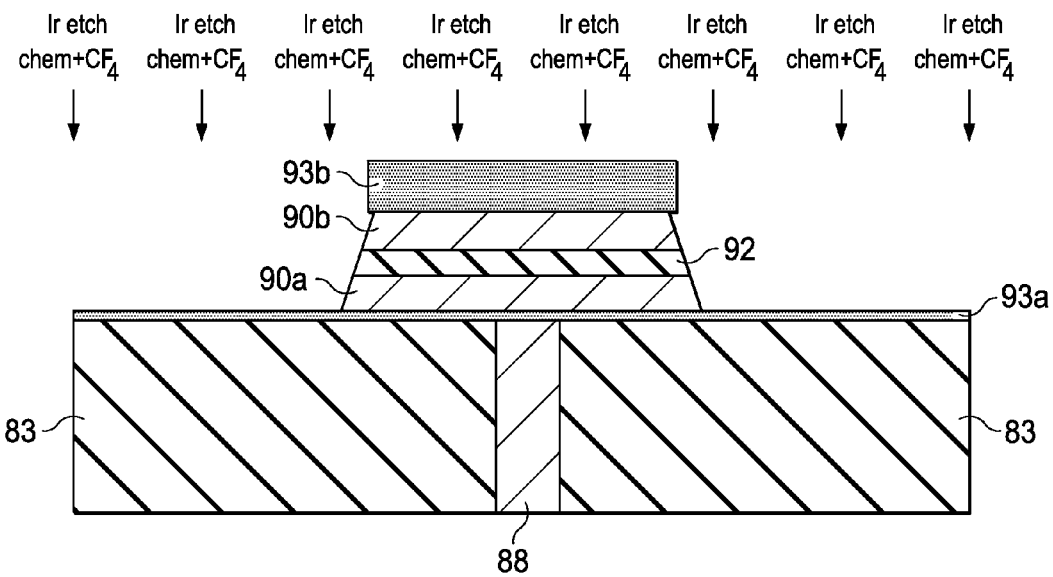
Figure 4H:
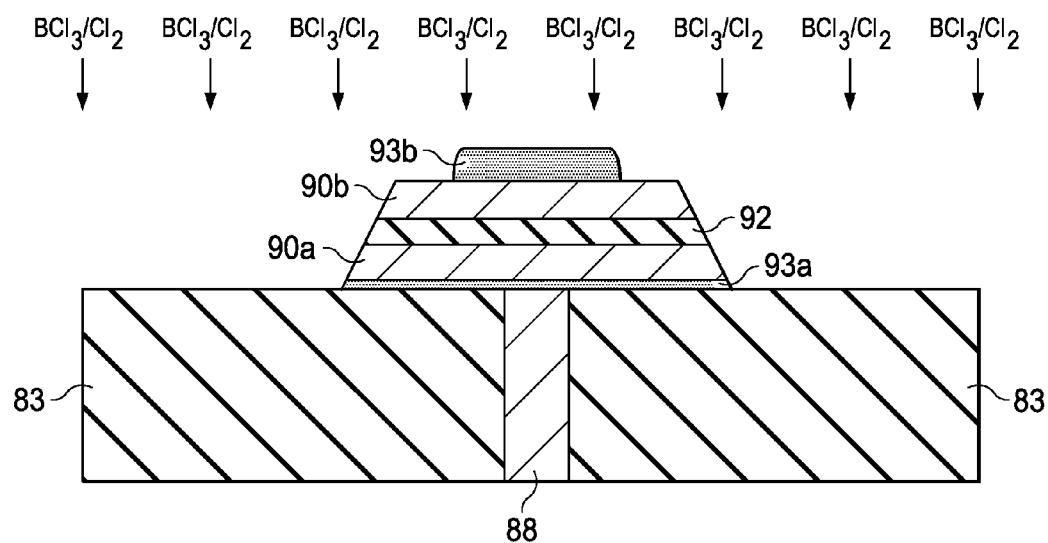

Process 56, in which PZT ferroelectric layer 92 is etched using hard mask element 93b and the remaining upper conductive plate layer 90b as a mask, is then performed after a gas change in the plasma chamber. According to this embodiment, PZT etch process 56 is performed in the same plasma chamber as processes 50 through 54, using a non-fluorine chemistry. An example of process 56 according to this embodiment uses a chemistry of $BCl_3$ and argon, at somewhat reduced bottom electrode bias (e.g., on the order of 900 W) to favor chemical etching of PZT ferroelectric layer 92 relative to the physical etching mechanism. FIG. 4f schematically illustrates PZT etch process 56 according to this embodiment. PZT etch process 56 may terminate upon endpoint detection identifying the time at which lower conductive plate layer 90b begins to be etched; alternatively, a timed etch may be used if desired.

Process 58 is then performed to etch lower conductive plate layer 90a. According to this embodiment, in which iridium metal is used as lower conductive plate layer 90a, etch process 58 is an plasma etch involving a fluorine-bearing active species, for example $CF_4$. The conditions of etch process 58 may be the same as used for etch process 50 for the etching of upper conductive plate layer 90b, for example with $CF_4$ at a flow ranging from about 10 sccm to about 30 sccm, more typically at a flow ranging from about 15 sccm to about 26 sccm, in combination with chlorine and oxygen gases at flows similar to those of conventional iridium etch processes (e.g., 50 and 140 sccm, respectively). As in the case of process 50, etch process 58 is performed at relatively high bottom electrode bias power, for example at about 1300 W, to facilitate the physical etching mechanism and thus a steep sidewall angle for the structure.

It has been observed, in connection with this invention, that despite the high bias power that favors physical etching of the iridium of lower conductive plate layer 90a, little if any iridium remains along the sidewalls of PZT ferroelectric layer 22 after the completion of stack etch process 46. It is believed that the $CF_4$ (or other fluorine-bearing) species in this lower plate etch process 58 cleans the sidewalls of PZT ferroelectric layer 92 of any sputtered iridium that is deposited during process 58. In addition, despite the presence of fluorine in the plasma of etch process 58 while the PZT sidewalls are exposed, little if any fluorine contamination at the PZT-plate interfaces has been observed. Accordingly, the use of a fluorine-bearing species such as $CF_4$ in etch process 58 has been observed, according to this invention, to allow the use of a high bias power in the etching of lower conductive plate layer 90a, which enables the steepening of the sidewalls of the capacitor structure without risking shorting of the resulting ferroelectric capacitor 80.

Lower plate etch process 58 continues, in this embodiment, until endpoint detection indicates that barrier layer 93a has been reached by the etch, following which a timed overetch under these same conditions is performed. Following a gas change in the plasma chamber, barrier layer etch process 60 is then performed. An example of process 60 according to this embodiment uses an etch chemistry of $BCl_3$ in combination with $Cl_2$ and argon, at reduced source power (e.g., 1600 W) and bias RF power (e.g., 180 W) as compared with the other etch processes. Barrier layer etch process 60 continues until endpoint detection indicates completion, followed by a timed overetch as conventional. Of course, because hard mask element 93b and barrier layer 93a are of the same material in this embodiment, etch process 60 will also etch hard mask element 93b both vertically and also laterally from the sidewalls of upper conductive plate layer 90b, as shown schematically in FIG. 4h. Following the overetch, an additional timed etch at very low bias RF power may be performed, using $BCl_3$ as the species, to chemically remove the remainder of hard mask element 93b. Stack etch process 46 is then complete, resulting in the structure as shown in FIG. 3.

Additional processing to complete the integrated circuit including ferroelectric capacitors 80, transistors 81, and such other structures as desired for the circuit function, is then performed in process 48 (FIG. 2a). As well known in the art, this additional processing of process 48 includes the forming of one or more levels of conductors and interlevel dielectrics. The formation of passivation films such as described in U.S. Patent Application Publication US 2013/0056811, commonly assigned herewith and incorporated herein by this reference, may also be performed.

It has been observed that stack etch processes according to these embodiments provide important advantages over conventional ferroelectric capacitor stack etch processes. As described above, it is believed that the use of a fluorine-bearing species in the plasma etch of the lower conductive plate material removes iridium that is sputtered onto the sidewalls of the PZT ferroelectric material as a by-product of the lower plate etch. This effect enables the use of high bias RF power levels to facilitate the physical etching mechanism and thus steepen the sidewalls of the resulting ferroelectric stack structure. This has been confirmed by way of experiments in which the lower plate etch has been performed using $CF_4$, resulting in sidewall angle φ values at or exceeding about 75° at $CF_4$ flow of about 15 sccm, and ranging up to about 80° at a $CF_4$ flow of about 26 sccm, with little if any vulnerability to plate-to-plate shorting. In addition, no degradation in the switching polarization performance of the capacitor structures was observed, confirming that the use of a fluorine-bearing species in the stack etch according to these embodiments does not cause detectable fluorine contamination at the PZT-plate interfaces.

These effects have significant impact on the design and layout of integrated circuits that include ferroelectric capacitors, for example ferroelectric random access memories (FRAMs) having an array of ferroelectric memory cells. In particular, the tradeoffs among switching polarization, spacing critical dimension, and capacitor density are relaxed by this steeper sidewall angle φ. For example, the steeper sidewall angle φ allows the density of capacitors per unit area to be increased while maintaining the necessary spacing critical dimensions between each capacitor and its neighboring capacitor or contact, and while maintaining the switching polarization performance of the capacitors. On the other hand, the spacing margins between each capacitor and its neighboring structures can be increased for capacitors of the same size and density; additional switching polarization capability may also be obtained by increasing the capacitor size without reducing spacing margins or device density. It is contemplated that those skilled in the art having reference to this specification can readily evaluate these tradeoffs as relaxed by the use of a stack etch according to these embodiments, as appropriate for a given implementation.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an integrated circuit including ferroelectric capacitors, comprising the steps of:
    depositing a first conductive layer comprising iridium near a semiconducting surface of a body;
    depositing a ferroelectric layer comprising lead-zirconium-titanate over the first conductive film;
    depositing a second conductive layer comprising iridium overlying the ferroelectric layer;
    depositing a hard mask layer over the second conductive layer;
    patterning and etching the hard mask layer to define mask elements at one or more locations at which capacitors are to be formed; and
    then removing portions of the first and second conductive films, and the ferroelectric material, at the location defined by the mask elements;
    wherein the removing step comprises:
        removing exposed portions of the second conductive layer by exposing the body to a plasma of a plurality of gases comprising a fluorine-bearing species;
        then removing exposed portions of the ferroelectric layer by exposing the body to a plasma of a non-fluorine-bearing plurality of gases; and
        then removing exposed portions of the first conductive layer by exposing the body to a plasma of a plurality of gases comprising a fluorine-bearing species.

2. The method of claim 1, wherein the step of removing exposed portions of the first conductive layer is performed while applying RF bias power of at least about 1000 W to an electrode in the etch chamber at which the body is disposed.

3. The method of claim 2, wherein the step of removing exposed portions of the ferroelectric layer is performed at a lower RF bias power at the electrode in the etch chamber at which the body is disposed that that of the step of removing exposed portions of the first conductive layer.

4. The method of claim 1, wherein the fluorine-bearing species comprises $CF_4$.

5. The method of claim 4, wherein the non-fluorine-bearing plurality of gases comprise a chlorine-bearing gas and an inert gas.

6. The method of claim 1, further comprising:
    during the removing step, performing endpoint detection;
    wherein the step of removing exposed portions of the second conductive layer is performed until endpoint detection detects the removal of ferroelectric material.

7. The method of claim 6, further comprising:
    responsive to endpoint detection detecting the removal of ferroelectric material, then pumping out fluorine-bearing gases in a plasma chamber in which the body is disposed;
    wherein the step of removing exposed portions of the ferroelectric layer is performed after the pumping out step.

8. The method of claim 1, further comprising:
    before the step of depositing the first conductive layer, depositing a barrier layer.

9. The method of claim 8, wherein the barrier layer and the hard mask layer are comprised of the same material.

10. The method of claim 9, wherein the barrier layer and the hard mask layer comprise TiAlON.

11. The method of claim 9, further comprising:
    after the step of removing exposed portions of the first conductive layer, then removing exposed portions of the barrier layer.

12. The method of claim 1, wherein, after the step of removing exposed portions of the first conductive layer, sidewalls of the ferroelectric layer are at an angle relative to the horizontal of at least about 75°.

* * * * *